(12) United States Patent  (10) Patent No.: US 7,675,310 B2
Sullivan  (45) Date of Patent: Mar. 9, 2010

(54) DEVICE UNDER TEST POWER SUPPLY

(75) Inventor: Patrick Gerard Sullivan, San Diego, CA (US)

(73) Assignee: Planet ATE, Inc., Poway, CA (US)

( * ) Notice: Subject to any disclaimer, the term of this patent is extended or adjusted under 35 U.S.C. 154(b) by 421 days.

(21) Appl. No.: 11/584,840

(22) Filed: Oct. 23, 2006

(65) Prior Publication Data

US 2008/0094098 A1  Apr. 24, 2008

(51) Int. Cl.
*G01R 31/26* (2006.01)
(52) U.S. Cl. ..................................... 324/765
(58) Field of Classification Search ........................ None
See application file for complete search history.

(56) References Cited

U.S. PATENT DOCUMENTS

| 4,158,803 | A | * | 6/1979 | Berger | .......................... 323/292 |
| 6,456,103 | B1 | | 9/2002 | Eldridge et al. | .............. 324/765 |
| 6,496,028 | B1 | * | 12/2002 | Manhaeve et al. | ........... 324/763 |
| 6,504,395 | B1 | * | 1/2003 | Johnson | ....................... 324/765 |
| 6,756,807 | B2 | * | 6/2004 | Johnson et al. | .............. 324/771 |
| 7,236,905 | B2 | * | 6/2007 | Kodera | ........................ 702/124 |
| 2005/0285613 | A1 | | 12/2005 | Isakharov et al. | ............ 324/765 |

* cited by examiner

*Primary Examiner*—Jermele M Hollington
(74) *Attorney, Agent, or Firm*—Dicke, Billig & Czaja, PLLC

(57) ABSTRACT

A power supply includes a first amplifier, a first current stage, and a second current stage. The first amplifier is configured to set an output voltage equal to a fixed input voltage for supplying to a device. The first current stage is configured to source and sink a first range of first output currents and provide a first measurement current representing a first output current. The second current stage is configured to source and sink a second range of second output currents and provide a second measurement current representing a second output current in response to the first range being exceeded. The first output current and the second output current are summed for supplying to the device. The first measurement current and the second measurement current are summed at a node.

20 Claims, 7 Drawing Sheets

DEVICE UNDER TEST POWER SUPPLY

BACKGROUND

A device under test (DUT) power supply (DPS) is typically employed to provide a constant output voltage for testing integrated circuits. The DPS should provide an accurate output voltage while sourcing and/or sinking a wide range of currents to the DUT. In addition, the DPS should respond quickly to transient currents without compromising the accuracy of the output voltage. Further, the DPS should be able to drive a wide range of capacitive loads and remain stable.

To achieve the desired accuracy, DPS circuits are typically closed loop systems. Because of the limitations of closed loop response times, a DPS typically employs large external capacitances to help provide transient currents to the DUT. Providing a stable solution under large capacitive loads can be very difficult. Under large capacitive loads, the DPS provides large amounts of current to recharge the external capacitance. In addition, the large external capacitance is commonly switched out of the circuit to enhance low current measurements when the capacitance is not needed. Therefore, the DPS typically needs to be stable under light capacitive load conditions as well as under large capacitive load conditions.

In addition to providing the accurate output voltage, the DPS should also accurately measure the currents it sources and/or sinks to the DUT without affecting the accuracy of the output voltage. To measure the current provided to the DUT accurately, several ranges are typically used. The ranges should be able to be changed to search for the measured current without affecting the accuracy of the output voltage. When the accuracy of the output voltage is affected, it is termed glitching.

Typical DPS circuits include an amplifier and a series sense resistor or resistors. A bypass capacitor is coupled across the sense resistor or resistors and a load capacitor is coupled between the DUT and common or ground. An input forcing voltage and the forced output voltage supplied to the DUT are provided to the amplifier. In response to the forcing voltage and forced output voltage, the amplifier adjusts the forced output voltage to equal the forcing voltage. The current supplied to the DUT is measured by measuring the voltage drop across a sense resistor. The load capacitor is selected to keep the DUT forced output voltage constant by providing additional transient current to the DUT when the bandwidth of the DPS is insufficient. The load capacitor introduces a pole. The bypass capacitor is used to lower the sense resistor impedance at higher frequencies by introducing a zero. Unless the bypass capacitor is on the order of the load capacitor, the zero does not completely cancel the pole. Also, as the bypass capacitor gets larger, another pole is introduced.

During range switching, glitching is typically a major issue. Since the output of the amplifier is slow to react, an instantaneous current is provided during range switching. This current causes a voltage excursion until the loop can respond. In addition, in a selected range, the current is limited to a maximum value. Therefore, the typical DPS has several disadvantages. First, changing the measure current range can cause aberrations or glitches in the forced output voltage due to the opening and closing of the loop. Second, in low current ranges, a large series resistance is used. Since the load capacitor is usually large, a low frequency pole is introduced that when added to the pole of the amplifier can cause the system to become unstable. The bypass capacitor should be carefully selected to avoid instability by introducing a zero. Third, the low range current is limited by the range resistor. In all but the highest current range, the circuit cannot provide maximum current. Finally, current limiting is range dependent.

For these and other reasons, there is a need for the present invention.

SUMMARY

One embodiment provides a power supply. The power supply includes a first amplifier, a first current stage, and a second current stage. The first amplifier is configured to set an output voltage equal to a fixed input voltage for supplying to a device. The first current stage is configured to source and sink a first range of first output currents and provide a first measurement current representing a first output current. The second current stage is configured to source and sink a second range of second output currents and provide a second measurement current representing a second output current in response to the first range being exceeded. The first output current and the second output current are summed for supplying to the device. The first measurement current and the second measurement current are summed at a node.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
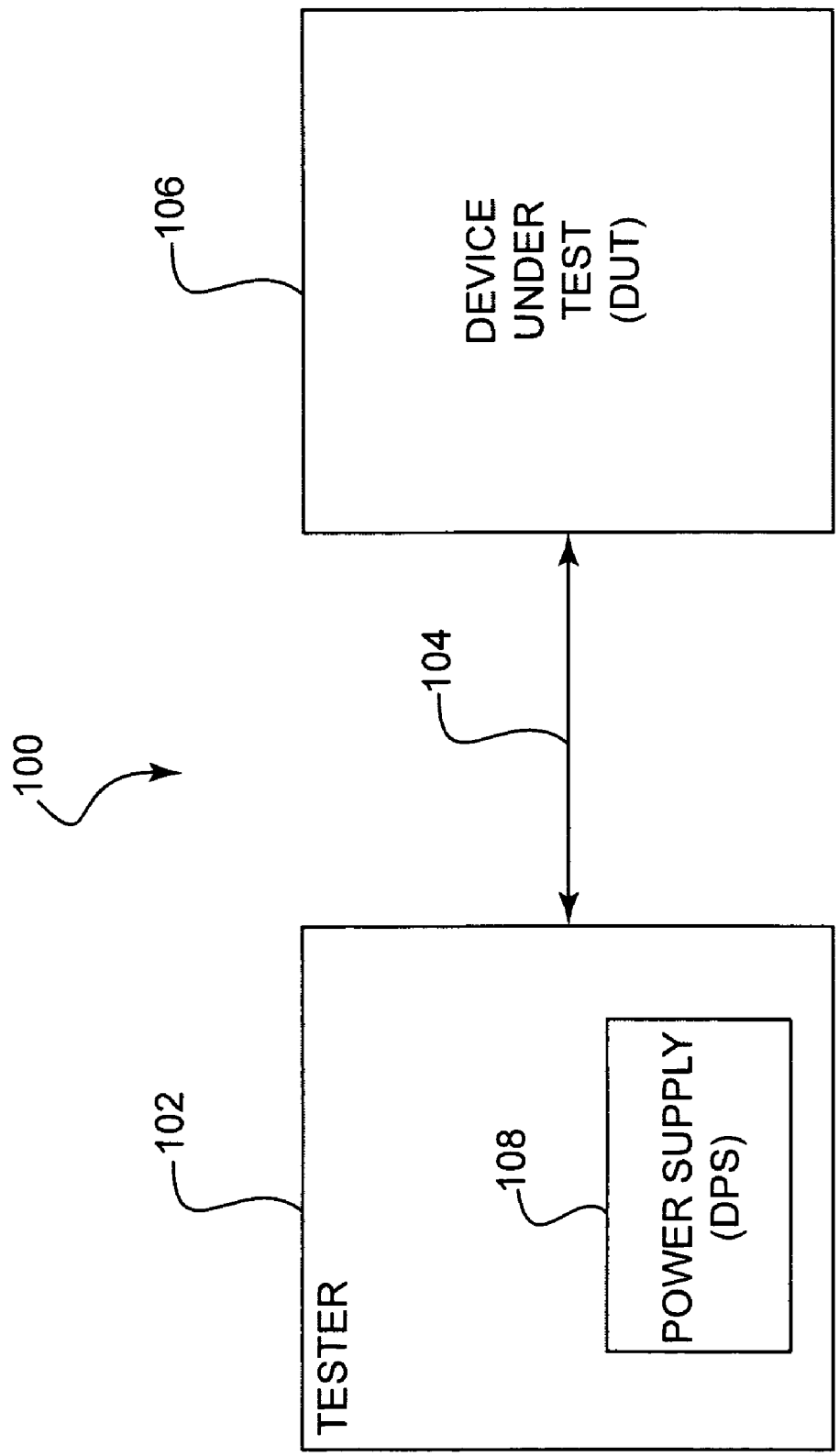
FIG. 1 is a block diagram illustrating one embodiment of a test system.

FIG. 1 is a block diagram illustrating one embodiment of a test system 100. Test system 100 includes tester 102 and a device under test (DUT) 106. Tester 102 includes a DUT power supply (DPS) 108. Tester 102 is electrically coupled to DUT 106 through communications path 104. Tester 102 tests DUT 106 through communications path 104. DUT 106 can be any suitable integrated circuit, such as a processor or memory.

DPS 108 supplies a constant output voltage to DUT 106 based on a forcing voltage input while supplying a variable current (sourcing and/or sinking) to DUT 106. In addition, DPS 108 includes a measure current circuit for measuring the variable current supplied to DUT 106. In one embodiment, DPS 108 provides glitchless transitions from a low current range to a high current range and from the high current range to the low current range. In one embodiment, the glitchless transitions are achieved by using a control loop that remains closed during transitions between the low current range and the high current range.

The variable current supplied to DUT 106 is replicated within DPS 108 to provide a measure current. In one embodiment, the measure current is independent of the forcing function (i.e., outside the loop) such that the measure current can be accurately measured by switching current ranges without glitching. In addition, in one embodiment no series resistance is used within DPS 108 and therefore a pole is not introduced at this node. Further, one embodiment of DPS 108 includes a fast transient current response since large transient currents consumed by DUT 106 are supplied. The large transient currents are supplied to DUT 106 since there is no range resistor limiting the supplied current.

In addition, one embodiment of DPS 108 includes a fast measure current response since the current range of DPS 108 can be switched without waiting for the loop to settle. In one embodiment, the measure current is also independent of the force voltage. In one embodiment, full current can be driven at any range since the high current range is automatically supplied when the output current exceeds the low current range. In one embodiment, both large DC and AC currents are available to DUT 106 even when in the low current range.

Figure 2:
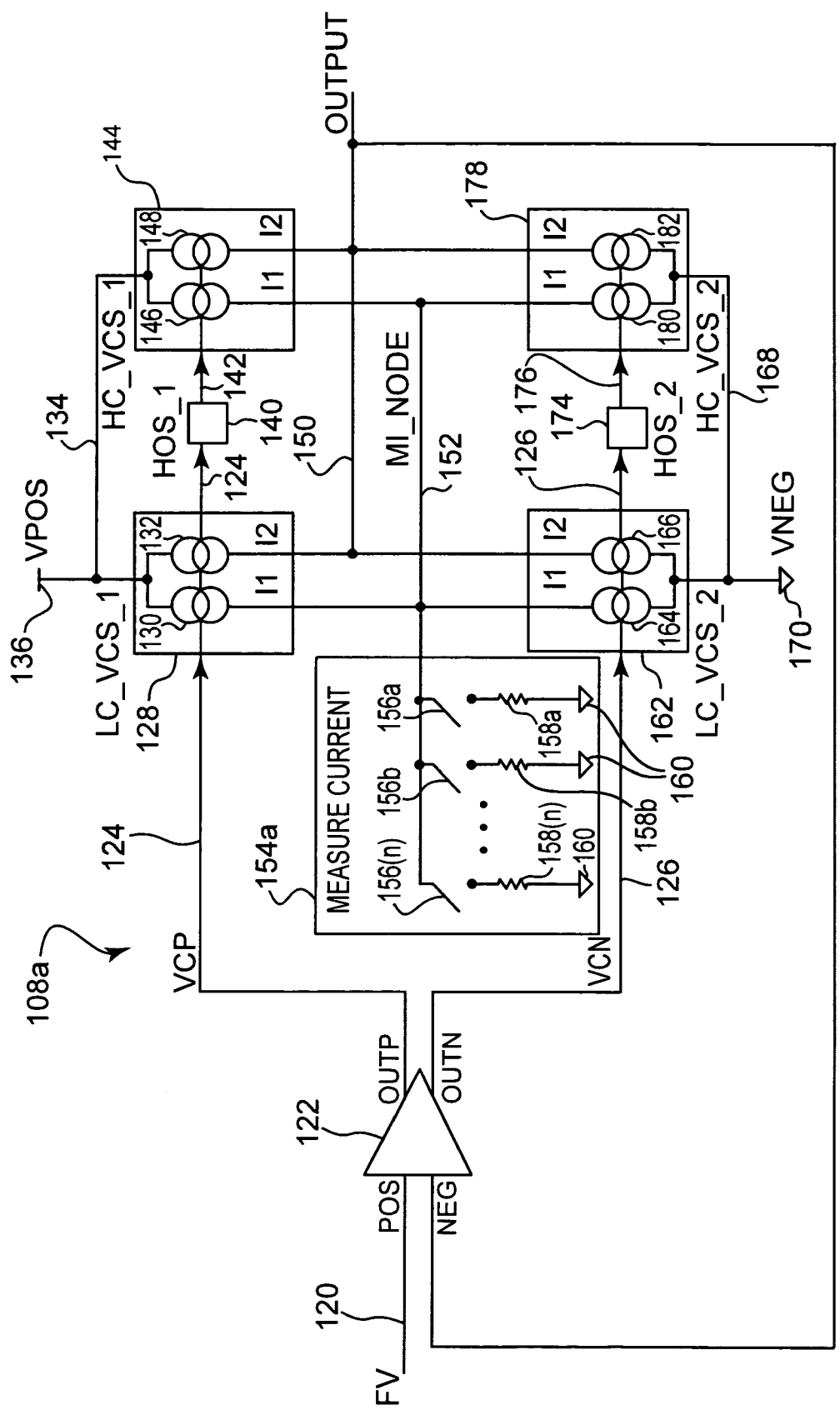
FIG. 2 is a schematic diagram illustrating one embodiment of a device under test (DUT) power supply (DPS).

FIG. 2 is a schematic diagram illustrating one embodiment of a DPS 108a which can be one embodiment of DPS 108 in test system 100. DPS 108a includes amplifier 122, a first low current voltage controlled current source (LC_VCS_1) 128, a first high range offset (HOS_1) 140, a first high current voltage controlled current source (HC_VCS_1) 144, a measure current circuit 154a, a second low current voltage controlled current source (LC_VCS_2) 162, a second high range offset (HOS_2) 174, and a second high current voltage controlled current source (HC_VCS_2) 178. LC_VCS_1 128 and LC_VCS_2 162 provide a low current stage. HOS_1 140 and HOS_2 174 provide a range offset stage. HC_VCS_1 144 and HC_VCS_2 178 provide a high current stage.

Measure current circuit 154a includes switches 156a-156(n) and resistors 158a-158(n), where "n" is any suitable integer for providing a desired number of current measurement ranges. LC_VCS_1 128 includes a first current source 130 and a second current source 132. LC_VCS_2 162 includes a first current source 164 and a second current source 166. HC_VCS_1 144 includes a first current source 146 and a second current source 148. HC_VCS_2 178 includes a first current source 180 and a second current source 182.

The positive (POS) input of amplifier 122 receives a force voltage (FV) signal on FV signal path 120. The positive output (OUTP) of amplifier 122 is electrically coupled to the control input of first current source 130, the control input of second current source 132, and the input of HOS_1 140 through voltage control positive (VCP) signal path 124. The output of HOS_1 140 is electrically coupled to the control input of first current source 146 and the control input second current source 148 through signal path 142.

A positive reference voltage (VPOS) 136 is electrically coupled to one side of first current source 130, one side of second current source 132, one side of first current source 146, and one side of second current source 148 through signal path 134. The output I1 of first current source 130 and the output I1 of first current source 146 are electrically coupled to measure current node (MI_NODE) signal path 152. The output I2 of second current source 132 and the output I2 of second current source 148 are electrically coupled to OUTPUT signal path 150.

The negative output (OUTN) of amplifier 122 is electrically coupled to the control input of first current source 164, the control input of second current source 166, and the input of HOS_2 174 through voltage control negative (VCN) signal path 126. The output of HOS_2 174 is electrically coupled to the control input of first current source 180 and the control input of second current source 182 through signal path 176.

A negative reference voltage (VNEG) 170 is electrically coupled to one side of first current source 164, one side of second current source 166, one side of first current source 180, and one side of second current source 182 through signal path 168. The output I1 of first current source 164 and the output I1 of first current source 180 are electrically coupled to MI_NODE signal path 152. The output I2 of second current source 166 and the output I2 of second current source 182 are electrically coupled to OUTPUT signal path 150.

OUTPUT signal path 150 is electrically coupled to the negative (NEG) input of amplifier 122. MI_NODE signal path 152 is electrically coupled to one side of each switch 156a-156(n). The other side of each switch 156a-156(n) is electrically coupled to one side of a resistor 158a-158(n). The other side of each resistor 158a-158(n) is electrically coupled to common or ground 160.

Amplifier 122 receives the FV signal on FV signal path 120 and the OUTPUT signal on OUTPUT signal path 150 to provide the VCP signal on VCP signal path 124 and the VCN signal on VCN signal path 126. Amplifier 122 adjusts the VCP signal and the VCN signal to force the OUTPUT signal voltage to be equal to the FV signal. In response to the OUTPUT signal sourcing current to DUT 106, amplifier 122 reduces the voltage of the VCP signal below a quiescent voltage and maintains the VCN signal at a quiescent voltage. The voltage of the VCP signal is based on the current being sourced to DUT 106. In response to the OUTPUT signal sinking a current from DUT 106, amplifier 122 raises the voltage of the VCN signal above a quiescent voltage and maintains the VCP signal at a quiescent voltage. The voltage of the VCN signal is based on the current being sinked from DUT 106.

First current source 130 and second current source 132 of LC_VCS_1 128 receive the VCP signal on VCP signal path 124 to provide a first current output I1 and a second current output I2. In response to the VCP signal having a voltage equal to the quiescent voltage of LC_VCS_1 128, first current source 130 sources a standby current to MI_NODE signal path 152 and second current source 132 sources a standby current to OUTPUT signal path 150. The standby current, as described further below, is also sinked by LC_VCS_2 162 in a standby mode such that the current on MI_NODE signal path 152 is 0 mA and the current on OUTPUT signal path 150 is 0 mA. In response to the VCP signal having a voltage less than the quiescent voltage of LC_VCS_1 128, first current source 130 sources a low range current to MI_NODE signal path 152 and second current source 132 sources a low range current to OUTPUT signal path 150. In one embodiment, first current source 130 sources the same current to MI_NODE signal path 152 as second current source 132 sources to OUTPUT signal path 150. In another embodiment, first current source 130 sources a fractional portion of the current sourced by second current source 132.

HOS_1 140 receives the VCP signal on VCP signal path 124 to provide the signal on signal path 142. HOS_1 140 provides a level shifted VCP signal on signal path 142. HOS_1 140 provides the signal on signal path 142 to enable HC_VCS_1 144 in response to LC_VCS_1 128 reaching its maximum current output for an accurate measurement.

First current source 146 and second current source 148 of HC_VCS_1 144 receive the signal on signal path 142 to provide a first current output I1 and a second current output I2. In response to the signal on signal path 142 having a voltage greater than or equal to the quiescent voltage for HC_VCS_1 144, first current source 146 and second current source 148 are disabled and the I1 and I2 outputs are high impedance. In response to the signal on signal path 142 having a voltage less than the quiescent voltage for HC_VCS_1 144 by an amount equal to the VCP change required to set LC_VCS_1 128 to its maximum current output for an accurate measurement, first current source 146 sources a high range current to MI_NODE signal path 152 and second current source 148 sources a high range current to OUTPUT signal path 150. In one embodiment, first current source 146 sources the same current to MI_NODE signal path 152 as second current source 148 sources to OUTPUT signal path 150. In another embodiment, first current source 146 sources a fractional portion of the current sourced by second current source 148.

First current source 164 and second current source 166 of LC_VCS_2 162 receive the VCN signal on VCN signal path 126 to provide a first current output I1 and a second current output I2. In response to the VCN signal having a voltage equal to the quiescent voltage of LC_VCS_2 162, first current source 164 sinks the standby current from MI_NODE signal path 152 and second current source 166 sinks the standby current from OUTPUT signal path 150. The standby current, as described above, is sourced by LC_VCS_1 128 in a standby mode such that the current on MI_NODE signal path 152 is 0 mA and the current on OUTPUT signal path 150 is 0 mA. In response to the VCN signal having a voltage greater than the quiescent voltage of LC_VCS_2 162, first current source 164 sinks a low range current from MI_NODE signal path 152 and second current source 166 sinks a low range current from OUTPUT signal path 150. In one embodiment, first current source 164 sinks the same current from MI_NODE signal path 152 as second current source 166 sinks from OUTPUT signal path 150. In another embodiment, first current source 164 sinks a fractional portion of the current sinked by second current source 166.

HOS_2 174 receives the VCN signal on VCN signal path 126 to provide the signal on signal path 176. HOS_2 174 provides a level shifted VCN signal on signal path 176. HOS_2 174 provides the signal on signal path 176 to enable HC_VCS_2 178 in response to LC_VCS_2 162 reaching its maximum current output for an accurate measurement.

First current source 180 and second current source 182 of HC_VCS_2 178 receive the signal on signal path 176 to provide a first current output I1 and a second current output I2. In response to the signal on signal path 176 having a voltage less than or equal to the quiescent voltage for HC_VCS_2 178, first current source 180 and second current source 182 are disabled and the I1 and I2 outputs are high impedance. In response to the signal on signal path 176 having a voltage greater than the quiescent voltage for HC_VCS_2 178 by an amount equal to the VCN change required to set LC_VCS_2 162 to its maximum current output for an accurate measurement, first current source 180 sinks a high range current from MI_NODE signal path 152 and second current source 182 sinks a high range current from OUTPUT signal path 150. In one embodiment, first current source 180 sinks the same current from MI_NODE signal path 152 as second current source 182 sinks from OUTPUT signal path 150. In another embodiment, first current source 180 sinks a fractional portion of the current sinked by second current source 182.

The I1 current outputs from first current sources 130, 146, 164, and 180 are summed on MI_NODE signal path 152. The I2 current outputs from second current sources 132, 148, 166, and 182 are summed on OUTPUT signal path 150. In one embodiment, the current on MI_NODE signal path 152 is a replica of the current on OUTPUT signal path 150. In another embodiment, the current on MI_NODE signal path 152 is a fraction of the current on OUTPUT signal path 150. In either embodiment, by measuring the current on MI_NODE signal path 152, the current on OUTPUT signal path 150 can be determined.

Measure current circuit 154a receives the MI_NODE signal on MI_NODE signal path 152 and measures the current of the MI_NODE signal. The user of tester 102 selects the desired current measurement range by selecting the appropriate resistor 158a-158(n) by selecting the appropriate switch 156a-156(n). The MI_NODE current produces a voltage across the selected resistor 158a-158(n) that is proportional to the current. By measuring the voltage across the selected resistor 158a-158(n), the MI_NODE current, and therefore the OUTPUT current is determined. Since the MI_NODE signal on MI_NODE signal path 152 is outside of the loop providing the OUTPUT signal on OUTPUT signal path 150, changing the current range by switching between resistors 158a-158(n) has no effect on the loop stability or the OUTPUT signal.

In operation, the OUTPUT voltage on OUTPUT signal path 150 is maintained at the FV voltage provided on FV signal path 120. A DUT 106 receives the OUTPUT signal. In response to DUT 106 sinking a current within the low current range, LC_VCS_1 128 sources the current to DUT 106 with HC_VCS_1 144 and HC_VCS_2 178 disabled. In response to DUT 106 sinking a current greater than the low current range can provide for an accurate measurement, HC_VCS_1 144 turns on to source the current to DUT 106 based on the signal from HOS_1 140 with HC_VCS_2 178 disabled. In response to DUT 106 sourcing a current within the low current range, LC_VC_2 162 sinks the current from DUT 106 with HC_VCS_1 144 and HC_VCS_2 178 disabled. In response to DUT 106 sourcing a current greater than the low current range can sink for an accurate measurement, HC_VCS_2 178 turns on to sink the current from DUT 106 based on the signal from HOS_2 174 with HC_VCS_1 144 disabled.

Measure current circuit 154a receives a replica or a fraction of the current provided on OUTPUT signal path 150 through MI_NODE signal path 152. The replica or fraction of the current through MI_NODE signal path 152 is then used to measure the current on OUTPUT signal path 150 by selecting the appropriate range resistor 158a-158(n).

Figure 3:
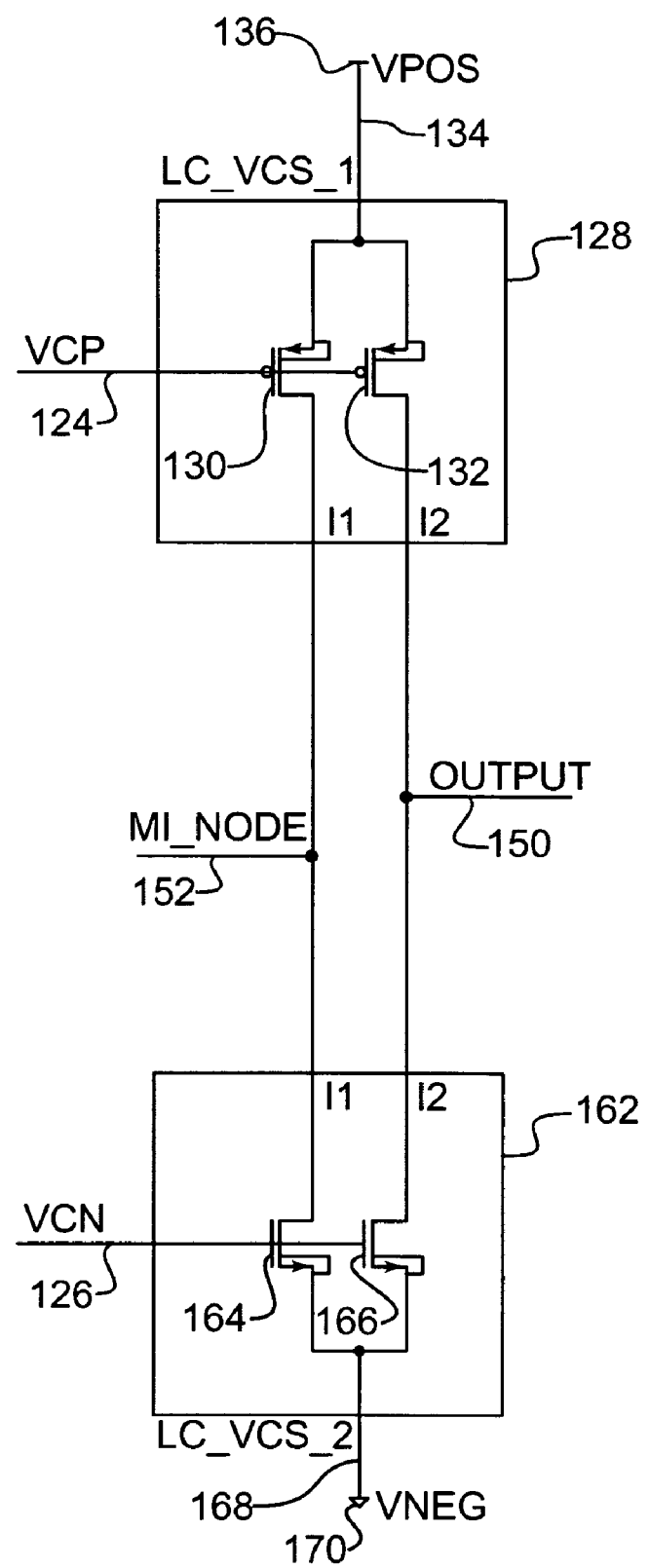
FIG. 3 is a schematic diagram illustrating one embodiment of a low current stage.

FIG. 3 is a schematic diagram illustrating one embodiment of the low current stage provided by LC_VCS_1 128 and LC_VCS_2 162. In one embodiment, first current source 130 of LC_VCS_1 128 includes a first transistor and second current source 132 of LC_VCS_1 128 includes a second transistor. The gate of first transistor 130 and the gate of second transistor 132 receive the VCP signal on VCP signal path 124. The source of transistor 130 and the source of transistor 132 are electrically coupled to VPOS 136 through signal path 134. The drain of transistor 130, which is the output I1, is electrically coupled to MI_NODE signal path 152. The drain of transistor 132, which is the output I2, is electrically coupled to OUTPUT signal path 150.

In one embodiment, first current source 164 of LC_VCS_2 162 includes a first transistor and second current source 166 of LC_VCS_2 162 includes a second transistor. The gate of first transistor 164 and the gate of second transistor 166 receive the VCN signal on VCN signal path 126. The source of transistor 164 and the source of transistor 166 are electrically coupled to VNEG 170 through signal path 168. The drain of transistor 164, which is the output I1, is electrically coupled to MI_NODE signal path 152. The drain of transistor 166, which is the output I2, is electrically coupled to OUTPUT signal path 150.

In one embodiment, first transistor 130 and second transistor 132 of LC_VCS_1 128 are p-channel metal oxide semiconductor (MOS) field effect transistors (FETs). In response to a sufficiently high VCP voltage on VCP signal path 124, first transistor 130 and second transistor 132 remain off. In response to a sufficiently low VCP voltage on VCP signal path 124, first transistor 130 turns on to source current to MI_NODE signal path 152 and second transistor 132 turns on to source current to OUTPUT signal path 150. In one embodiment, first transistor 130 and second transistor 132 are matched to source the same current on both MI_NODE signal path 152 and OUTPUT signal path 150.

In one embodiment, first transistor 164 and second transistor 166 of LC_VCS_2 162 are n-channel MOSFETs. In response to a sufficiently low VCN voltage on VCN signal path 126, first transistor 164 and second transistor 166 remain off. In response to a sufficiently high VCN voltage on VCN signal path 126, first transistor 164 turns on to sink current from MI_NODE signal path 152 and second transistor 166 turns on to sink current from OUTPUT signal path 150. In one embodiment, first transistor 164 and second transistor 166 are matched to sink the same current from both MI_NODE signal path 152 and OUTPUT signal path 150. In one embodiment, HC_VCS_1 144 and HC_VCS_2 178 are similar to LC_VCS_1 128 and LC_VCS_2 162, except that HC_VCS_1 144 and HC_VCS_2 178 source and sink larger currents than LC_VCS_1 128 and LC_VCS_2 162.

Figure 4A:
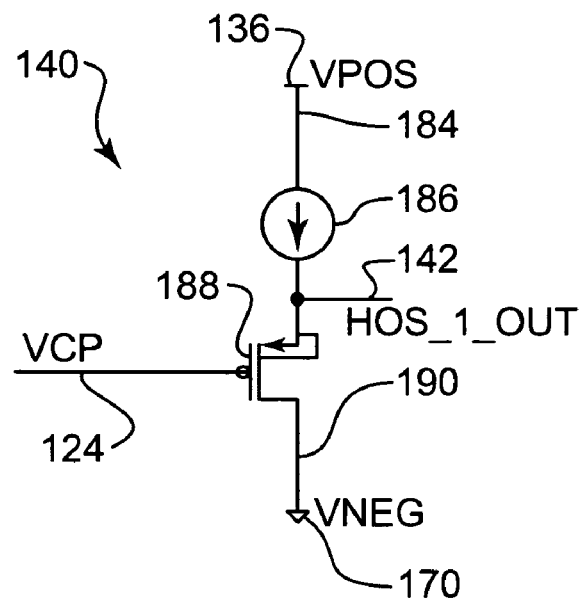
FIG. 4A is a schematic diagram illustrating one embodiment of a high range offset circuit.

FIG. 4A is a schematic diagram illustrating one embodiment of HOS_1 140. HOS_1 140 includes a current source 186 and a transistor 188. One side of current source 186 is electrically coupled to VPOS 136 through signal path 184. The other side of current source 186 provides the HOS_1_OUT signal and is electrically coupled to the source of transistor 188 through signal path 142. The gate of transistor 188 receives the VCP signal on VCP signal path 124. The drain of transistor 188 is electrically coupled to VNEG 170 through signal path 190. In one embodiment, transistor 188 is a p-channel MOSFET. Transistor 188 is configured as a source follower. In response to a VCP signal on VCP signal path 124, a level shifted VCP signal is provided on HOS_1_OUT signal path 142.

Figure 4B:
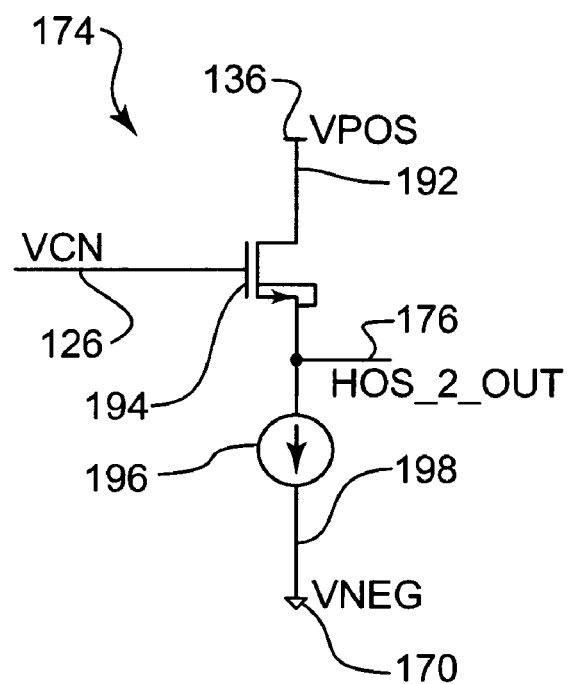
FIG. 4B is a schematic diagram illustrating another embodiment of a high range offset circuit.

FIG. 4B is a schematic diagram illustrating one embodiment of HOS_2 174. HOS_2 174 includes a current source 196 and a transistor 194. One side of current source 196 is electrically coupled to VNEG 170 through signal path 198. The other side of current source 196 provides the HOS_2_OUT signal and is electrically coupled to the source of transistor 194 through signal path 176. The gate of transistor 194 receives the VCN signal on VCN signal path 126. The drain of transistor 194 is electrically coupled to VPOS 136 through signal path 192. In one embodiment, transistor 194 is an n-channel MOSFET. Transistor 194 is configured as a source follower. In response to a VCN signal on VCN signal path 126, a level shifted VCN signal is provided on HOS_2_OUT signal path 176.

Figure 5:
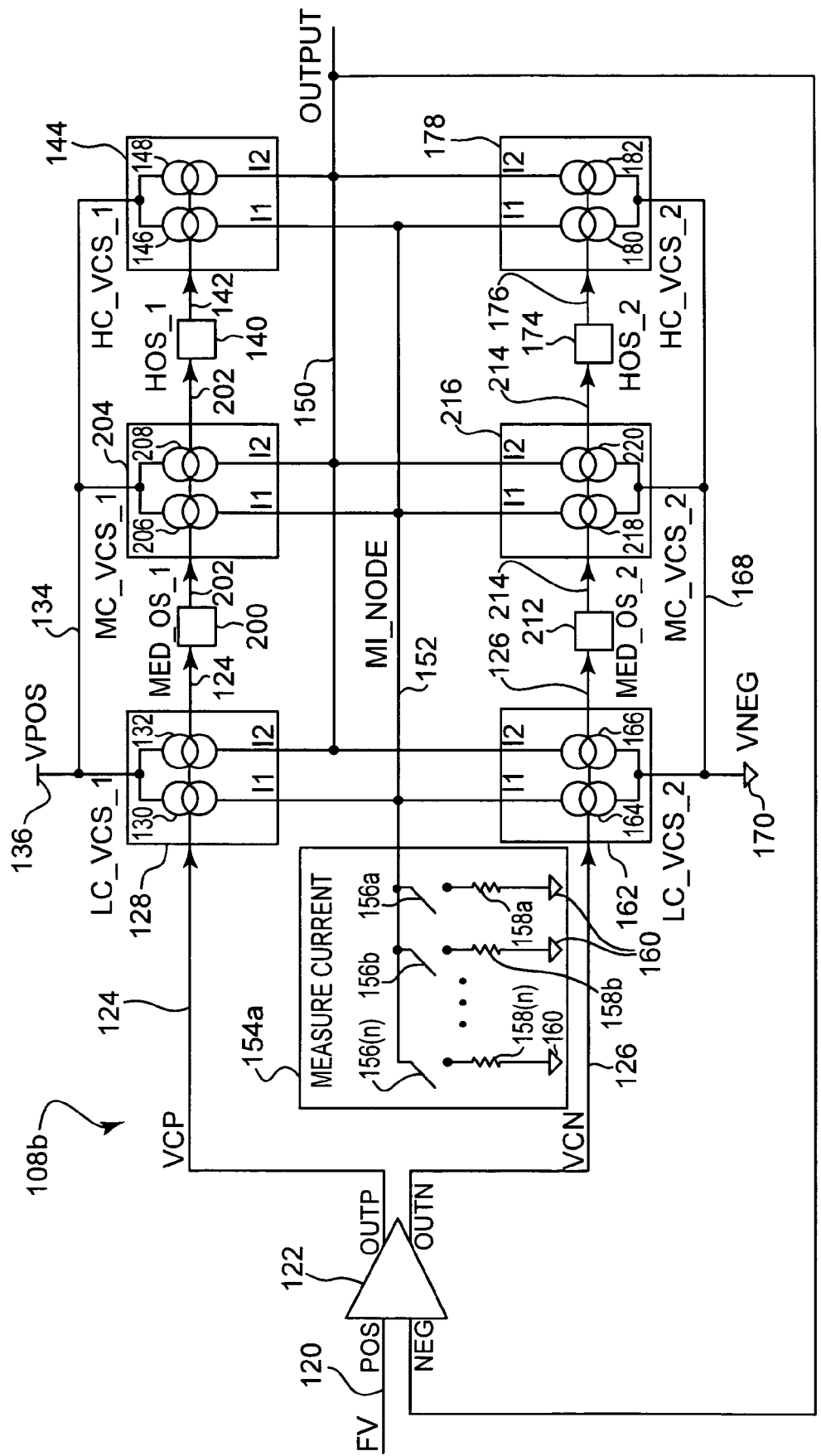
FIG. 5 is a schematic diagram illustrating another embodiment of a DPS.

FIG. 5 is a schematic diagram illustrating one embodiment of a DPS 108b which can be one embodiment of DPS 108 in test system 100. DPS 108b is similar to DPS 108a previously described and illustrated with reference to FIG. 2, except that DPS 108b includes an additional medium current range. By adding the additional medium current range to the DPS, greater accuracy in the low current range can be obtained. In addition to the components included in DPS 108a, DPS 108b also includes a first medium range offset (MED_OS_1) 200, a second medium range offset (MED_OS_2) 212, a first medium current voltage controlled current source (MC_VCS_1) 204, and a second medium current voltage controlled current source (MC_VCS_2) 216. MED_OS_1 200 and MED_OS_2 212 provide an offset stage. MC_VCS_1 204 and MC_VCS_2_216 provide a medium current stage. MC_VCS_1 204 includes a first current source 206 and a second current source 208. MC_VCS_2 216 includes a first current source 218 and a second current source 220.

The input of MED_OS_1 200 is electrically coupled to the OUTP output of amplifier 122 through VCP signal path 124. The output of MED_OS_1 200 is electrically coupled to the control input of first current source 206, the control input of second current source 208, and the input of HOS_1 140 through signal path 202. VPOS 136 is electrically coupled to one side of first current source 206 and one side of second current source 208 through signal path 134. The output I1 of first current source 206 is electrically coupled to MI_NODE signal path 152. The output I2 of second current source 208 is electrically coupled to OUTPUT signal path 150.

The input of MED_OS_2 212 is electrically coupled to the OUTN output of amplifier 122 through VCN signal path 126. The output of MED_OS_2 212 is electrically coupled to the control input of first current source 218, the control input of second current source 220, and the input of HOS_2 174 through signal path 214. VNEG 170 is electrically coupled to one side of first current source 218 and one side of second current source 220 through signal path 168. The output I1 of first current source 218 is electrically coupled to MI_NODE signal path 152. The output I2 of second current source 220 is electrically coupled to OUTPUT signal path 150.

MED_OS_1 200 receives the VCP signal on VCP signal path 124 to provide the signal on signal path 202. MED_OS_1 200 provides a level shifted VCP signal on signal path 202. MED_OS_1 200 provides the signal on signal path 202 to enable MC_VCS_1 204 in response to LC_VCS_1 128 reaching its maximum current output for an accurate measurement. In one embodiment, MED_OS_1 200 is similar to HOS_1 140 previously described and illustrated with reference to FIG. 4A.

First current source 206 and second current source 208 of MC_VCS_1 204 receive the signal on signal path 202 to provide a first current output I1 and a second current output I2. In response to the signal on signal path 202 having a voltage greater than or equal to the quiescent voltage for MC_VCS_1 204, first current source 206 and second current source 208 are disabled and outputs I1 and I2 are high impedance. In response to the signal on signal path 202 having a voltage less than the quiescent voltage for MC_VCS_1 204 by an amount equal to the VCP change required to set LC_VCS_1 128 to its maximum current output for an accurate measurement, first current source 206 sources a medium range current to MI_NODE signal path 152 and second current source 208 sources a medium range current to OUTPUT signal path 150. In one embodiment, first current source 206 sources the same current to MI_NODE signal path 152 as second current source 208 sources to OUTPUT signal path 150. In another embodiment, first current source 206 sources a fractional portion of the current sourced by second current source 208.

MED_OS_2 212 receives the VCN signal on VCN signal path 126 to provide the signal on signal path 214. MED_OS_2 212 provides a level shifted VCN signal on signal path 214. MED_OS_2 212 provides the signal on signal path 214 to enable MC_VCS_2 216 in response to LC_VCS_2 162 reaching its maximum current output for an accurate measurement. In one embodiment, MED_OS_2 212 is similar to HOS_2 174 previously described and illustrated with reference to FIG. 4B.

First current source 218 and second current source 220 of MC_VCS_2 216 receive the signal on signal path 214 to provide a first current output I1 and a second current output I2. In response to the signal on signal path 214 having a voltage less than or equal to the quiescent voltage for MC_VCS_2 216, first current source 218 and second current source 220 are disabled and outputs I1 and I2 are high impedance. In response to the signal on signal path 214 having a voltage greater than the quiescent voltage for MC_VCS_2 216 by an amount equal to the VCN change required to set LC_VCS_2 162 to its maximum current output for an accurate measurement, first current source 218 sinks a medium range current from MI_NODE signal path 152 and second current source 220 sinks a medium range current from OUTPUT signal path 150. In one embodiment, first current source 218 sinks the same current from MI_NODE signal path 152 as second current source 220 sinks from OUTPUT signal path 150. In another embodiment, first current sourced 218 sinks a fractional portion of the current sinked by second current source 220. In one embodiment, MC_VCS_1 204 and MC_VCS_2 216 are similar to LC_VCS_1 128 and LC_VCS_2 162 previously described and illustrated with reference to FIG. 3, except that MC_VCS_1 204 and MC_VCS_2 216 source and sink larger currents than LC_VCS_1 128 and LC_VCS_2 162.

HOS_1 140 receives the signal on signal path 202 to provide the signal on signal path 142. HOS_1 140 level shifts the signal on signal path 202 to provide the signal on signal path 142. HOS_1 140 provides the signal on signal path 142 to enable HC_VCS_1 144 in response to MC_VCS_1 204 reaching its maximum current output for an accurate measurement.

HOS_2 174 receives the signal on signal path 214 to provide the signal on signal path 176. HOS_2 174 level shifts the signal on signal path 214 to provide the signal on signal path 176. HOS_2 174 provides the signal on signal path 176 to enable HC_VCS_2 178 in response to MC_VCS_2 216 reaching its maximum current output for an accurate measurement.

The I1 current outputs from first current sources 130, 206, 146, 164, 218, and 180 are summed on MI_NODE signal path 152. The I2 current outputs from second current sources 132, 208, 148, 166, 220, and 182 are summed on OUTPUT signal path 150. In one embodiment, the current on MI_NODE signal path 152 is a replica of the current on OUTPUT signal path 150. In another embodiment, the current on MI_NODE signal path 152 is a fraction of the current on OUTPUT signal path 150. In either embodiment, by measuring the current on MI_NODE signal path 152, the current on OUTPUT signal path 150 can be determined.

In operation, the OUTPUT voltage on OUTPUT signal path 150 is maintained at the FV voltage provided on FV signal path 120. DUT 106 receives the OUTPUT signal. In response to DUT 106 sinking a current within the low current range, LC_VCS_1 128 sources the current to DUT 106 with MC_VCS_1 204, MC_VCS_2 216, HC_VCS_1 144, and HC_VCS_2 178 disabled. In response to DUT 106 sinking a current greater than the low current range can provide for an accurate measurement, MC_VCS_1 204 turns on to source the current to DUT 106 based on the signal from MED_OS_1 200 with MC_VCS_2 216, HC_VCS_1 144, and HC_VCS_2 178 disabled. In response to DUT 106 sinking a current greater than the medium current range can provide for an accurate measurement, HC_VCS_1 144 also turns on to source the current to DUT 106 based on the signal from HOS_1 140 with MC_VCS_2 216 and HC_VCS_2 178 disabled.

In response to DUT 106 sourcing a current within the low current range, LC_VC_2 162 sinks the current from DUT 106 with MC_VCS_1 204, MC_VCS_2 216, HC_VCS_1 144, and HC_VCS_2 178 disabled. In response to DUT 106 sourcing a current greater than the low current range can sink for an accurate measurement, MC_VCS_2 216 turns on to sink the current from DUT 106 based on the signal from MED_OS_2 212 with MC_VCS_1 204, HC_VCS_1 144, and HC_VCS_2 178 disabled. In response to DUT 106 sourcing a current greater than the medium current range can sink for an accurate measurement, HC_VCS_2 178 also turns on to sink the current from DUT 106 based on the signal from HOS_2 174 with MC_VCS_1 204 and HC_VCS_1 144 disabled. Measure current circuit 154a receives a replica or a fraction of the current provided on OUTPUT signal path 150 through MI_NODE signal path 152. The replica or fraction of the current through MI_NODE signal path 152 is then used to measure the current on OUTPUT signal path 150 by selecting the appropriate range resistor 158a-158(n).

Figure 6:
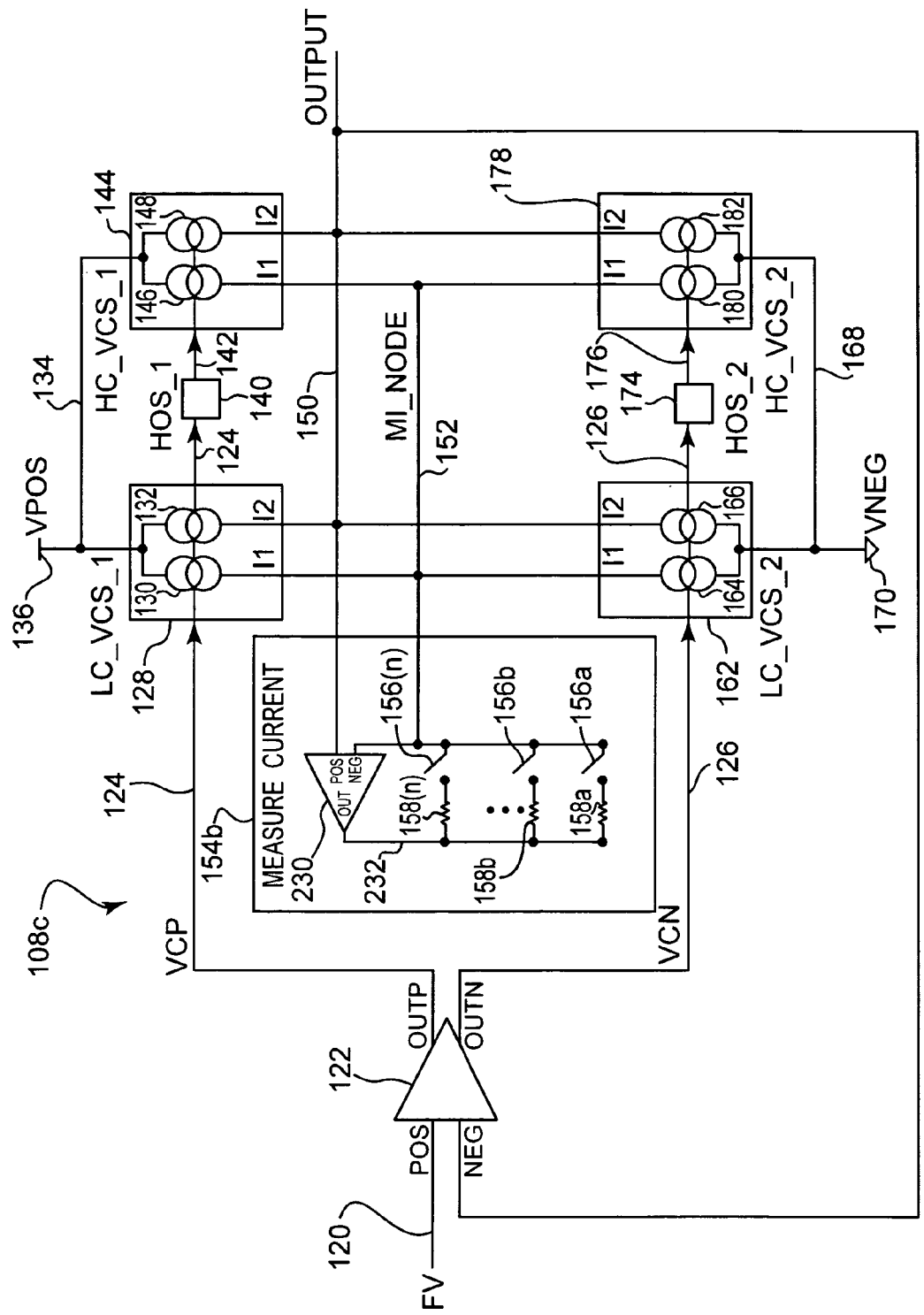
FIG. 6 is a schematic diagram illustrating another embodiment of a DPS.

FIG. 6 is a schematic diagram illustrating one embodiment of a DPS 108c which can be one embodiment of DPS 108 in test system 100. DPS 108c is similar to DPS 108a previously described and illustrated with reference to FIG. 2, except that in DPS 108c measure current circuit 154a is replaced with measure current circuit 154b. Measure current circuit 154b includes amplifier 230, switches 156a-156(n), and resistors 158a-158(n).

The POS input of amplifier 230 receives the OUTPUT signal on OUTPUT signal path 150. The NEG input of amplifier 230 and one side of each switch 156a-156(n) receive the MI_NODE signal on MI_NODE signal path 152. The output of amplifier 230 is electrically coupled to one side of each resistor 158-158(n) through signal path 232. The other side of each resistor 158-158(n) is electrically coupled to the other side of a switch 156a-156(n). Amplifier 230 forces the OUTPUT signal and the MI_NODE signal to be equal. Therefore, improved accuracy for the current measurements is provided.

Measure current circuit 154b measures the current of the MI_NODE signal. The user of tester 102 selects the desired current measurement range by selecting the appropriate resistor 158a-158(n) by selecting the appropriate switch 156a-156(n). The current through the selected resistor 158a-158(n) provides a voltage that is proportional to the current. By measuring the voltage across the selected resistor 158a-158(n), the MI_NODE current, and therefore the OUTPUT current is determined.

Figure 7:
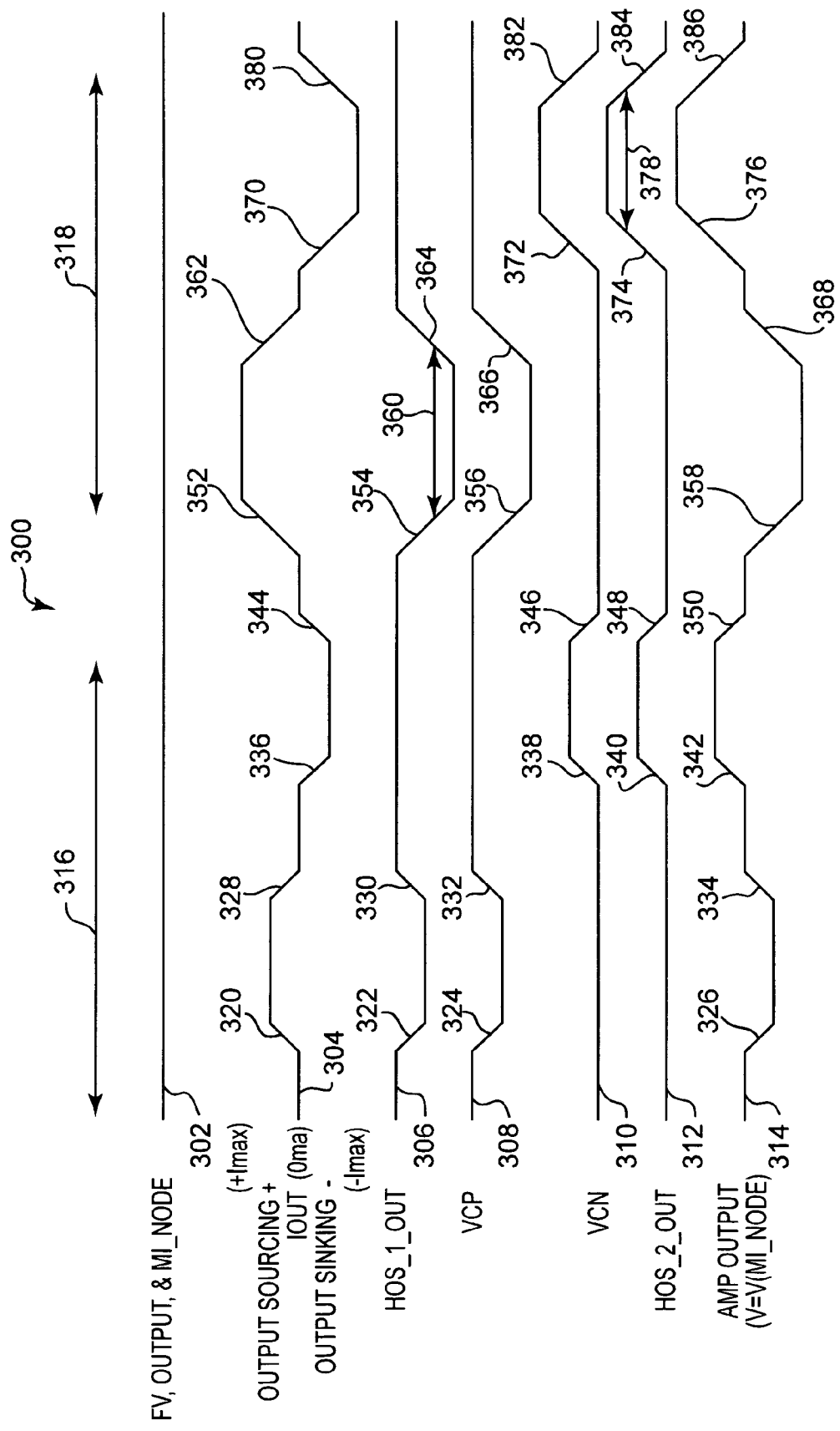
FIG. 7 is a waveform diagram illustrating one embodiment of signals within DPS embodiment illustrated in FIG. 6.

FIG. 7 is a waveform diagram 300 illustrating one embodiment of signals within DPS 108c. Waveform diagram 300 includes the FV signal on FV signal path 120, the OUTPUT signal on OUTPUT signal path 150, and the MI_NODE signal on MI_NODE signal path 152 as indicated as a constant voltage at 302, such as 3 volts. Waveform diagram 300 also includes OUTPUT current (IOUT) signal 304 on OUTPUT signal path 150, HOS_1_OUT signal 306 on HOS_1_OUT signal path 142, VCP signal 308 on VCP signal path 124, VCN signal 310 on VCN signal path 126, HOS_2_OUT signal 312 on HOS_2_OUT signal path 176, and amplifier output (AMP OUTPUT) signal 314 on signal path 232.

DPS 108c is operating in the low current range as indicated at 316 and in the high current range as indicated at 318. In response to DUT 106 sinking a low range current, IOUT signal 304 begins to source the low range current to DUT 106 as indicated at 320. In response to DUT 106 sinking the current at 320, amplifier 122 reduces the voltage of VCP signal 308 from a quiescent voltage at 324. In response to VCP signal 308 at 324, HOS_1 140 reduces HOS_1_OUT signal 306 from a quiescent voltage at 322. In response to the IOUT signal 304 at 320 and the replica current on MI_NODE signal path 152, amplifier 230 reduces the voltage of AMP OUTPUT signal 314 at 326.

In response to DUT 106 drawing zero or little current, IOUT signal 304 returns to zero or little current at 328. In response to DUT 106 drawing zero or little current, amplifier 122 increases the voltage of VCP signal 308 to the quiescent voltage at 332. In response to VCP signal 308 at 332, HOS_1 140 increases HOS_1_OUT signal 306 to the quiescent voltage at 330. In response to IOUT signal 304 at 328 and the replica current on MI_NODE signal path 152, amplifier 230 increases the voltage of AMP OUTPUT signal 314 at 334.

In response to DUT 106 sourcing a low range current, IOUT signal 304 begins to sink the low range current from DUT 106 as indicated at 336. In response to DUT 106 sourcing the current at 336, amplifier 122 increases the voltage of VCN signal 310 from a quiescent voltage at 338. In response to VCN signal 310 at 338, HOS_2 174 increases HOS_2_OUT signal 312 from a quiescent voltage at 340. In response to IOUT signal 304 at 336 and the replica current on MI_NODE signal path 152, amplifier 230 increases the voltage of AMP OUTPUT signal 314 at 342.

In response to DUT 106 drawing zero or little current, IOUT signal 304 returns to zero or little current at 344. In response to DUT 106 drawing zero or little current, amplifier 122 decreases the voltage of VCN signal 308 to the quiescent voltage at 346. In response to VCN signal 310 at 346, HOS_2 174 decreases HOS_2_OUT signal 312 to the quiescent voltage at 348. In response to IOUT signal 304 at 344 and the replica current on MI_NODE signal path 152, amplifier 230 decreases the voltage of AMP OUTPUT signal 314 at 350.

In response to DUT 106 sinking a high range current, IOUT signal 304 begins to source the high range current to DUT 106 as indicated at 352. In response to DUT 106 sinking the current at 352, amplifier 122 reduces the voltage of VCP signal 308 from the quiescent voltage at 356. In response to VCP signal 308 at 356, HOS_1 140 reduces HOS_1_OUT signal 306 from the quiescent voltage at 354. In response to HOS_1_OUT signal 306 at 354, HC_VCS_1 144 turns on as indicated at 360. In response to IOUT signal 304 at 352 and the replica current on MI_NODE signal path 152, amplifier 230 reduces the voltage of AMP OUTPUT signal 314 at 358.

In response to DUT 106 drawing zero or little current, IOUT signal 304 returns to zero or little current at 362. In response to DUT 106 drawing zero or little current, amplifier 122 increases the voltage of VCP signal 308 to the quiescent voltage at 366. In response to VCP signal 308 at 366, HOS_1 140 increases HOS_1_OUT signal 306 to the quiescent voltage at 364. In response to IOUT signal 304 at 362 and the replica current on MI_NODE signal path 152, amplifier 230 increases the voltage of AMP OUTPUT signal 314 at 368.

In response to DUT 106 sourcing a high range current, IOUT signal 304 begins to sink the high range current to DUT 106 as indicated at 370. In response to DUT 106 sourcing the current at 370, amplifier 122 increases the voltage of VCN signal 310 from the quiescent voltage at 372. In response to VCN signal 310 at 372, HOS_2 174 increases HOS_2_OUT signal 312 from the quiescent voltage at 374. In response to HOS_2_OUT signal 312 at 374, HC_VCS_2 178 turns on as indicated at 378. In response to IOUT signal 304 at 370 and the replica current on MI_NODE signal path 152, amplifier 230 increases the voltage of AMP OUTPUT signal 314 at 376.

In response to DUT 106 drawing zero or little current, IOUT signal 304 returns to zero or little current at 380. In response to DUT 106 drawing zero or little current, amplifier 122 decreases the voltage of VCN signal 310 to the quiescent voltage at 382. In response to VCN signal 310 at 382, HOS_2 174 decreases HOS_2_OUT signal 312 to the quiescent voltage at 384. In response to IOUT signal 304 at 380 and the replica current on MI_NODE signal path 152, amplifier 230 decreases the voltage of AMP OUTPUT signal 314 at 386.

Embodiments provide a DPS for testing a DUT. In one embodiment, the DPS includes glitchless current range switching and a measure current circuit. In one embodiment, the measure current circuit measures a replica of the current provided to the DUT such that the measure current circuit does not interfere with the forced output voltage.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power supply comprising:
   a first amplifier configured to set an output voltage equal to a fixed input voltage for supplying to a device;
   a first current stage configured to source and sink a first range of first output currents and provide a first measurement current representing a first output current; and
   a second current stage configured to source and sink a second range of second output currents and provide a second measurement current representing a second output current in response to the first range being exceeded,
   wherein the first output current and the second output current are summed for supplying to the device, and
   wherein the first measurement current and the second measurement current are summed at a node.

2. The power supply of claim 1, further comprising:
   a first range offset stage configured to enable the second current stage in response to the first range being exceeded.

3. The power supply of claim 2, wherein the first range offset stage comprises:

a first range offset for offsetting a first signal for enabling a sourcing portion of the second current stage; and a second range offset for offsetting a second signal for enabling a sinking portion of the second current stage.

4. The power supply of claim 3, wherein the first range offset comprises a first transistor configured as a first source follower and wherein the second range offset comprises a second transistor configured as a second source follower.

5. The power supply of claim 1, further comprising:

a circuit configured to measure a current at the node.

6. The power supply of claim 5, wherein the circuit comprises:

at least two switches, each switch coupled to the node; and at least two resistors, each resistor coupled to a switch, wherein one of the switches is closed to select one of the resistors for determining the current at the node based on a voltage across the selected resistor.

7. The power supply of claim 6, wherein the circuit comprises:

a second amplifier configured to set a voltage of the node equal to the output voltage.

8. The power supply of claim 1, further comprising:

a third current stage configured to source and sink a third range of third output currents and provide a third measurement current representing a third output current in response to the second range being exceeded, wherein the first output current, the second output current, and the third output current are summed for supplying to the device, and wherein the first measurement current, the second measurement current, and the third measurement current are summed at the node.

9. The power supply of claim 8, further comprising:

a second range offset stage configured to enable the third current stage in response to the second range being exceeded.

10. The power supply of claim 1, wherein the first current stage composes:

a first voltage controlled current source configured to source the first range of first output currents; and a second voltage controlled current source configured to sink the first range of first output currents.

11. The power supply of claim 10, wherein the first voltage controlled current source comprises:

a first current source configured to provide the first output current; and a second current source configured to provide the first measurement current.

12. The power supply of claim 11, wherein the first current source comprises a first transistor and wherein the second current source comprises a second transistor.

13. A power supply comprising:

means for setting an output voltage equal to a fixed input voltage for supplying to a device under test;

means for sourcing and sinking a first range of first output currents and providing a first measurement current representing a first output current;

means for sourcing and sinking a second range of second output currents and providing a second measurement current representing a second output current in response to the first range being exceeded;

means for summing the first output current and the second output current for supplying to the device under test; and means for summing the first measurement current and the second measurement current to provide a summed measurement current.

14. The power supply of claim 13, further comprising:

means for measuring the summed measurement current.

15. The power supply of claim 14, wherein the means for measuring the summed measurement current comprises means for setting a voltage equal to the output voltage at the means for summing the first measurement current and the second measurement current.

16. The power supply of claim 13, further comprising:

means for sourcing and sinking a third range of third output currents and providing a third measurement current representing a third output current in response to the second range being exceeded;

means for summing the first output current, the second output current, and the third output current for supplying to the device under test; and means for summing the first measurement current, the second measurement current, and the third measurement current to provide the summed measurement current.

17. A method for supplying power to a device, the method comprising:

setting an output voltage equal to a fixed input voltage for supplying to the device;

sourcing and sinking a first range of first output currents and providing a first measurement current representing a first output current;

sourcing and sinking a second range of second output currents and providing a second measurement current representing a second output current in response to the first range being exceeded;

summing the first output current and the second output current for supplying to the device; and summing the first measurement current and the second measurement current to provide a summed measurement current.

18. The method of claim 17, further comprising:

measuring the summed measurement current.

19. The method of claim 18, wherein measuring the summed measurement current comprises setting a voltage equal to the output voltage where the first measurement current and the second measurement current are summed.

20. The method of claim 17, further comprising:

sourcing and sinking a third range of third output currents and providing a third measurement current representing a third output current in response to the second range being exceeded;

summing the first output current, the second output current, and the third output current for supplying to the device; and summing the first measurement current, the second measurement current, and the third measurement current to provide the summed measurement current.

* * * * *